United States Patent
Pobedinskas et al.

(10) Patent No.: US 11,348,858 B2
(45) Date of Patent: May 31, 2022

(54) STRUCTURES AND METHOD FOR GROWING DIAMOND LAYERS

(71) Applicants: IMEC VZW, Leuven (BE); UNIVERSITEIT HASSELT, Hasselt (BE)

(72) Inventors: Paulius Pobedinskas, Boncelles (BE); Rajesh Ramaneti, Hasselt (BE); Ken Haenen, Hasselt (BE)

(73) Assignees: IMEC VZW, Leuven (BE); UNIVERSITEIT HASSELT, Hasselt (BE)

( * ) Notice: Subject to any disclaimer, the term of this patent is extended or adjusted under 35 U.S.C. 154(b) by 0 days.

(21) Appl. No.: 16/854,347

(22) Filed: Apr. 21, 2020

(65) Prior Publication Data
US 2020/0381331 A1    Dec. 3, 2020

(30) Foreign Application Priority Data

May 28, 2019   (EP) ..................................... 19177035

(51) Int. Cl.
| H01L 21/00 | (2006.01) |
| H01L 23/373 | (2006.01) |
| C30B 25/18 | (2006.01) |
| C30B 28/14 | (2006.01) |
| C30B 29/04 | (2006.01) |
| C30B 29/40 | (2006.01) |
| H01L 21/02 | (2006.01) |
| H01L 23/48 | (2006.01) |

(52) U.S. Cl.
CPC ........ *H01L 23/3732* (2013.01); *C30B 25/186* (2013.01); *C30B 28/14* (2013.01); *C30B 29/04* (2013.01); *C30B 29/406* (2013.01); *H01L 21/02115* (2013.01); *H01L 21/02312* (2013.01); *H01L 21/02389* (2013.01); *H01L 21/02414* (2013.01); *H01L 21/02491* (2013.01); *H01L 23/3735* (2013.01); *H01L 23/481* (2013.01)

(58) Field of Classification Search
None
See application file for complete search history.

(56) References Cited

U.S. PATENT DOCUMENTS 5,616,947 A * 4/1997 Tamura ............. H01L 21/28264
                                                              257/289
2007/0295993 A1   12/2007   Chen et al.
(Continued)

OTHER PUBLICATIONS

Soumen Mandal, Evan L. H. Thomas, Callum Middleton, Laia Gines, James T. Griffiths, Menno J. Kappers, Rachel A. Oliver, David J. Wallis, Lucy E. Goff, Stephen A. Lynch, Martin Kuball, and Oliver A. Williams ACS Omega 2017 2 (10), 7275-7280 DOI: 10.1021/acsomega.7b01069 (Year: 2017).*
(Continued)

*Primary Examiner* — Reema Patel
(74) *Attorney, Agent, or Firm* — McDonnell Boehnen Hulbert & Berghoff LLP

(57) ABSTRACT

An intermediate structure for forming a semiconductor device and method of making is provided. The intermediate device includes (i) a substrate comprising a Ga-based layer, and (ii) optionally, a metal layer on the substrate; wherein at least one of the Ga-based layer and, if present, the metal layer comprises at least a surface region having an isoelectric point of less than 7, usually at most 6.

18 Claims, 10 Drawing Sheets

(56) References Cited

U.S. PATENT DOCUMENTS

| | | | |
|---|---|---|---|
| 2009/0146186 A1* | 6/2009 | Kub | H01L 29/66462 |
| | | | 257/194 |
| 2012/0225536 A1 | 9/2012 | Korenstein et al. | |
| 2016/0013277 A1 | 1/2016 | Ho et al. | |
| 2017/0011914 A1 | 1/2017 | Sumant et al. | |

OTHER PUBLICATIONS

Goyal, Vivek, Anirudha V. Sumant, Desalegne Teweldebrhan, and Alexander A. Balandin. "Direct Low-Temperature Integration of Nanocrystalline Diamond with GaN Substrates for Improved Thermal Management of High-Power Electronics." Advanced Functional Materials 22, No. 7 (2012): 1525-1530.

Zhou, Yan, Rajesh Ramaneti, Julian Anaya, Svetlana Korneychuk, Joff Derluyn, Huarui Sun, James Pomeroy, Johan Verbeeck, Ken Haenen, and Martin Kuball. "Thermal characterization of polycrystalline diamond thin film heat spreaders grown on GaN HEMTs." Applied Physics Letters 111, No. 4 (2017): 041901.

* cited by examiner

STRUCTURES AND METHOD FOR GROWING DIAMOND LAYERS

CROSS REFERENCE

This application claims priority based on European Patent Application no. 19177035.3, filed May 28, 2019, which is incorporated by reference in its entirety.

FIELD OF THE DISCLOSURE

The present disclosure relates to the growth of a diamond layer over a substrate comprising a Ga-based layer and in particular to structures and methods therefor.

BACKGROUND OF THE DISCLOSURE

Diamond is known to be a good thermal conductor with crystalline diamond films having a thermal conductivity in the order of 2000 W/mK and even polycrystalline films (e.g. with a grain size of 1 μm and beyond) having thermal conductivities of 1000 W/mK. Diamond would thus be an interesting material for use as a heat sink or heat spreader in e.g. Ga-based semiconductor devices. However, beyond a certain thickness, diamond does not grow and adhere well on Ga-based layers (GaN or $Ga_2O_3$), so that the diamond layer has a tendency to peel off. Furthermore, growth of diamond at low growth rates directly on Ga-based layers such as GaN can result in etching of Ga-based surfaces; growth rates thus would need to be faster than the etch rate for the diamond to grow on the Ga-based surfaces.

This motivates the use of an interfacial dielectric layer (e.g. $SiN_x$ or $AlO_x$) on the Ga-based layer, as for example used by Zhou et al. (ZHOU, Yan, et al. Thermal characterization of polycrystalline diamond thin film heat spreaders grown on GaN HEMTs. Applied Physics Letters, 2017, 111.4: 041901.). Such an interfacial layer enables, after ultrasonication to form scratches prior to diamond seeding, the indirect adhesion of diamond on the underlying Ga-based layer and protects it from being etched away during the diamond growth.

However, the thermal conductivity of such interfacial dielectric layers can be very low; for example, bulk $SiN_x$ has an intrinsic thermal conductivity of about 10-40 W/m-K, which can be further reduced in an interfacial layer thereof to about 0.1-10 W/m-K. This can result in heat-trapping and a high thermal boundary resistance (e.g. greater than 20 $m^2K/GW$). Furthermore, the ultrasonication step which can be used to enable diamond seeding can also create defects in the Ga-based layers.

There is thus still a need in the art for better approaches for dealing with some or all of the above-mentioned problems.

SUMMARY OF THE DISCLOSURE

It is an object of the present disclosure to provide good intermediate structures for forming a semiconductor device on which a diamond layer either can be formed or has been formed. It is a further object of the present disclosure to provide good methods for forming said intermediate structures. This objective is accomplished by structures and methods according to the present disclosure.

In embodiments of the present disclosure, the disclosed approach may be suitable for both Ga-based layers and metal layers in a Ga based semiconductor device.

In embodiments of the present disclosure, diamond particles can be seeded, and a diamond layer can be formed, directly on a Ga-based or metal layer. In embodiments of the present disclosure, no interfacial dielectric layer needs to be used. In yet other embodiments of the present disclosure, good thermal contact between the diamond layer and the Ga-based or metal layer can be achieved.

In embodiments of the present disclosure, good attachment of the diamond layer can be achieved, i.e. the diamond layer has a low tendency to peel off. In other embodiments of the present disclosure, the diamond layer can be grown to an arbitrary thickness.

In embodiments of the present disclosure, the Ga-based or metal layer can be protected from being etched during diamond growth.

In embodiments of the present disclosure, the Ga-based or metal layer does not need to be scratched for diamond particle seeding, thereby not introducing surface defects.

In embodiments of the present disclosure, the F or S surface treatment can passivate existing surface defects in the Ga-based or metal layer.

In embodiments of the present disclosure, the diamond layer can also be used as (part of) an electrical contact in the semiconductor device.

In embodiments of the present disclosure, the diamond layers can be formed on the top or bottom side of the Ga-based or metal layer.

In embodiments of the present disclosure, a plurality of diamond layers can be formed on various surfaces of the intermediate structure.

In embodiments of the present disclosure, the semiconductor device can be made for a large variety of applications.

In embodiments of the present disclosure, the method can relatively straightforward and economical. In other embodiments of the present disclosure, the method can use techniques and materials which are commonly accessible in CMOS processing and semiconductor production plants.

In a first aspect, the present disclosure relates to an intermediate structure for forming a semiconductor device, comprising: (i) a substrate comprising a Ga-based layer, and (ii) optionally, a metal layer on the substrate; wherein at least one of the Ga-based layer and, if present, the metal layer comprises at least a surface region having an isoelectric point of less than 7, usually at most 6.

In a second aspect, the present disclosure relates to an intermediate structure for forming a semiconductor device, comprising: (i) a substrate comprising a Ga-based layer, and (ii) optionally, a metal layer on the substrate; wherein at least one of the Ga-based layer and, if present, the metal layer comprises at least a surface region comprising an F or S termination.

In a third aspect, the present disclosure relates to a method for forming the intermediate structure as defined in any of the previous claims, comprising: (a) providing a substrate comprising a Ga-based layer, and (b) optionally, providing a metal layer on the substrate; wherein at least one of the Ga-based layer and, if present, the metal layer comprises at least a surface region having an isoelectric point of less than 7, usually at most 6.

In a fourth aspect, the present disclosure relates to a method for forming the intermediate structure as defined in any of the previous claims, comprising: (a) providing a substrate comprising a Ga-based layer, and (b) optionally, providing a metal layer on the substrate; wherein at least one of the Ga-based layer and, if present, the metal layer comprises at least a surface region comprising an F or S termination.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE DRAWINGS

FIG. 6 depicts: (a) a substrate with a Ga-based layer (300) (e.g. GaN) being provided; (b) the Ga-based layer (300) prepared to obtain a pristine Ga-surface region; (c) the surface region fluorinated (600) by exposing it to an F plasma for 30 s or less at a power of 100 W or less; thereby forming a $GaF_x$ surface region (600); (d) the surface region (600) seeded with diamond particles (400); and (e) the substrate may be loaded in a chamber for low temperature (e.g. from 350 to 500° C.) or high temperature (e.g. above 500 to 800° C.) diamond growth, thereby turning the diamond particles (400) into a diamond layer (410).

FIG. 7 depicts: (a) a substrate with a Ga-based layer (300) (e.g. GaN) being provided; (b) a metal layer (800) (e.g. Cu) may be deposited over the substrate, e.g. by evaporation, sputtering or electrodeposition; (c) the surface region (600) may then be sulfurized by exposing it to ammonium sulphide in the form of an ammonium sulphide based organic solution for 1-30 min or in the form of an ammonium sulphide based vapour exposure for 1-10 min, or to hydrogen sulphide in the form of a hydrogen sulphide based (e.g. 5% $H_2S$/95% $N_2$) rapid thermal annealing at 400-500° C. for about 30 s, thereby forming a metal sulphide (e.g. $CuS_x$) surface region (600); (d) the surface region (600) may then be seeded with diamond particles (400); and (e) the substrate may loaded in a chamber for low temperature (350-500° C.) diamond growth, thereby turning the diamond particles (400) into a diamond layer (410).

FIG. 8 depicts: (a) a substrate with a Ga-based layer (300) (e.g. GaN) being provided; (b) organic contaminants are first removed by cleaning the substrate with a solvent (e.g. acetone or isopropanol) and a 10-20 nm metal layer (800) (e.g. Cu) may then deposited on the passivation layer (500) through evaporation or sputtering; (c) a photoresist (900) may be spin-coated over the metal layer (800); (d) a photoresist (900) may be patterned and the pattern may be transferred by etching it into the metal layer (800), thereby exposing the passivation layer (500); (e) the pattern may be transferred further by etching it into the dielectric layer, thereby exposing the Ga-based layer (300) and the corresponding surface region (600); (f) the surface region (600) may be fluorinated as described in Example 2a or sulfurized as described in Example 2b and then seeded with diamond particles (400); (g) the photoresist (900) may be removed (e.g. using acetone), leaving behind the metal layer (800) and the diamond particles (400) seeded on the Ga-based layer (300)'s surface region (600); (h) the substrate may be loaded in a chamber for low temperature (350-500° C.) or high temperature (500-800° C.) diamond growth, thereby turning the diamond particles (400) into a diamond layer (410); and (i) after diamond growth, the metal layer (800) can be etched away entirely or partially (e.g. by patterning the metal layer (800) to form a metal contact); e.g. using a wet etching which can be selective with respect to the passivation layer (500) and diamond layer (410).

Figure 1:
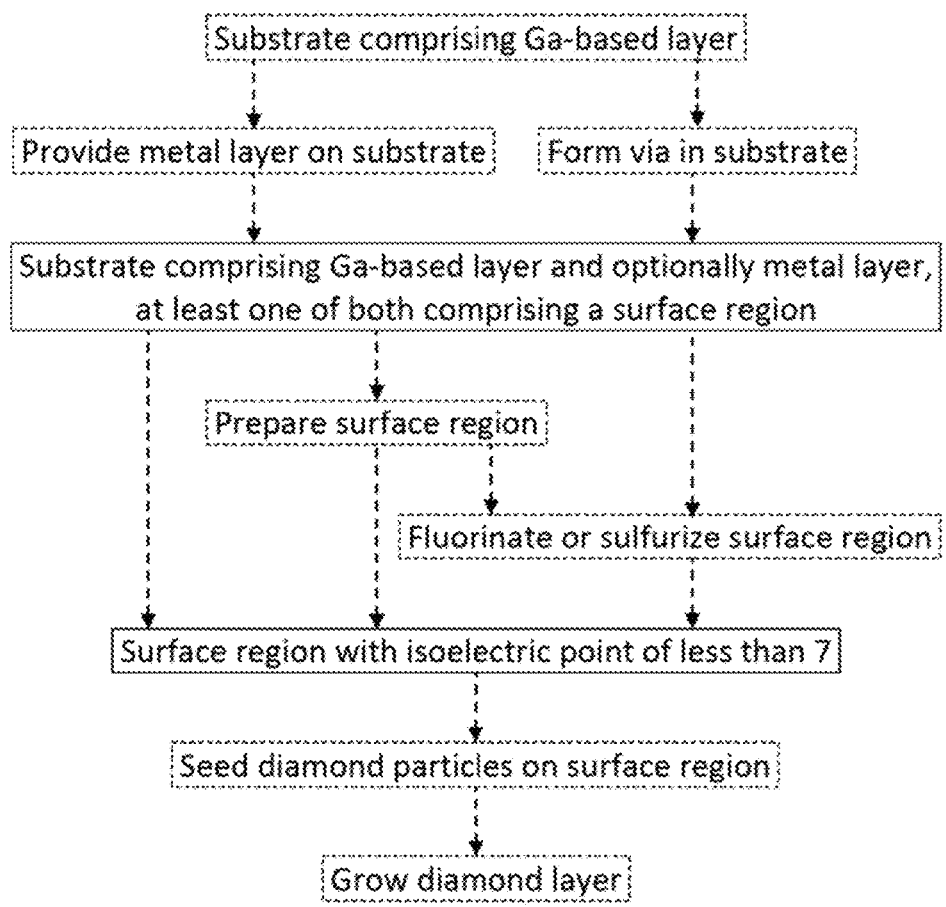
FIG. 1 depicts a flow chart of a representative method according to the third aspect, together with several optional steps.

In the different figures, the same reference signs refer to the same or analogous elements.

DETAILED DESCRIPTION OF THE DISCLOSURE

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, over, under, above, below and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various disclosed aspects. This method of disclosure, however, is not to be interpreted as reflecting an intention that the claimed invention requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

Reference will be made to transistors. These are devices having a first main electrode such as a drain, a second main electrode such as a source and a control electrode such as a gate for controlling the flow of electrical charges between the first and second main electrodes.

The following terms are provided solely to aid in the understanding of the disclosure.

As used herein, and unless otherwise specified, fluorinating a surface region refers to reacting the surface region with fluorine or a fluorine compound in order to obtain an F termination of the surface region.

As used herein, and unless otherwise specified, sulfurizing a surface region refers to reacting the surface region with sulphur or a sulphur compound in order to obtain an S termination of the surface region.

As used herein, and unless otherwise specified, the isoelectric point of a surface region (e.g. with an F or S termination) is the isoelectric point of the surface region in an uncovered state. Thus, when the surface region is covered with a layer, such as a diamond seed layer or a diamond layer, the isoelectric point of the surface region can be taken as that of the surface region before it was covered by said layer.

In a first aspect, the present disclosure relates to an intermediate structure for forming a semiconductor device, comprising: (i) a substrate comprising a Ga-based layer, and (ii) optionally, a metal layer on the substrate; wherein at least one of the Ga-based layer and, if present, the metal layer comprises at least a surface region having an isoelectric point of less than 7, usually at most 6.

It was found within the present disclosure that a good diamond particle seeding and subsequent diamond layer growth can be achieved on surface regions of Ga-based layers having an isoelectric point of less than 7. Such surface regions furthermore typically enable to form covalent bonds between the Ga-based layer and a diamond layer grown thereon. It was further found that the same approach can also be suitable for surface regions of metal layers in Ga-based semiconductor devices.

In embodiments, the substrate comprising the Ga-based layer may be a Ga-based single crystalline substrate or a Ga-based layer on a carrier layer (e.g. a Ga-based epitaxial film on a Si wafer, optionally with one or more buffer layers therebetween).

In embodiments, the Ga-based layer may be a Ga-based semiconductor layer. In embodiments, the Ga-based layer may comprise Ga and a group 15 (i.e. pnictogens) or group 16 (i.e. chalcogens). element. In embodiments, the Ga-based layer may comprise (e.g. consist of) GaN, AlGaN, $Ga_2O_3$ (e.g. β- or ε-$Ga_2O_3$) or $Ga_2S_3$. In embodiments wherein the Ga-based layer comprises the surface region, the Ga-based layer may consist of GaN, AlGaN, $Ga_2O_3$ save for the surface region. Indeed, GaN, AlGaN, and $Ga_2O_3$ typically have an isoelectric point of 7 or more, so that their surface region must be functionalized (e.g. with F or S; cf. infra) to achieve the desired isoelectric point. When the Ga-based layer consists of $Ga_2S_3$ and comprises the surface region, a separate functionalization (e.g. with F or S; cf. infra) of the surface region will not normally be required, as the $Ga_2S_3$ will typically automatically comprise an S-terminated surface region with the desired isoelectric point.

In embodiments, the surface region may comprise (e.g. have) an F or S termination. In embodiments, the F or S termination may be covalent in nature. The F termination may be used when a p-type semiconductor device is envisioned, while the S termination may be used when an n-type semiconductor device is envisioned. Alternatively, the S termination may be used for some metal layers; e.g. sulfurization of Cu tends to give a more stable functionalization than fluorination thereof. In embodiments the surface region may have a depth of 1 nm or less; i.e. the termination may extend 3 monolayers deep or less. In embodiments, the surface region may passivate surface defects. In embodiments, the surface region may form a barrier to prevent direct exposure of the rest of the Ga-based layer to the environment. This is, for example, beneficial in the case of a GaN layer, as this material shows a tendency to be etched under typical conditions for diamond growth.

In embodiments, the surface region may have an isoelectric point of at most 5, usually at most 4. Ga-based layers and metal layers having an F or S termination typically have a relatively low isoelectric point of about 4 or less.

In embodiments, the metal layer may have a thermal conductivity of at least 200 $Wm^{-1}K^{-1}$. In embodiments, the metal layer may comprise (e.g. consist of) a metal with a thermal conductivity of at least 200 $Wm^{-1}K^{-1}$; such as Cu, Al, Au, Ag or Be. In embodiments, the metal layer may be for forming a contact of the semiconductor device, such as a gate contact, source contact or drain contact. In embodiments, the contact may comprise a diamond layer (e.g. formed on the surface region of the metal layer).

In embodiments, the semiconductor device may be a diode (e.g. a Schottky barrier, p-n, p-i-n diode or light emitting diode), a transistor (e.g. a high electron mobility transistor, HEMT; metal-oxide-semiconductor field-effect transistor, MOSFET; metal-semiconductor field-effect transistor, MESFET; junction gate field-effect transistor, JFET; or field-effect transistor-based biosensor, BioFET) or an radio frequency device. The semiconductor device may, for example, find application in the high power (e.g. inverters), high frequency, communication, energy management, sensing or gaming systems.

In embodiments, the surface region may be exposed, or covered with a diamond seed layer, or covered with a diamond layer.

In embodiments, the surface region may be for forming a diamond layer thereon. In embodiments, the surface region may be for forming a strong chemical bond. A strong chemical bond may also be referred to as an 'Intramolecular bond' and encompasses e.g. a covalent, ionic or metallic bond; it is opposed to a weak chemical bond (or 'intermolecular bond'), which encompasses e.g. van der Waals interactions, dipole interactions or hydrogen bonds. In embodiments, the surface region may be for forming a covalent bond with the diamond layer thereon. The surface region and the diamond layer may, for example, be bonded together through F or S, i.e. in the form of a Ga—F—C, Ga—S—C, metal-F—C or metal-S—C bond (e.g. a corresponding covalent bond), or be bonded directly (e.g. after displacement of F or S), i.e. in the form of a Ga—C or metal-C bond (e.g. a corresponding covalent bond). The type of bonding between the surface region and the diamond layer may be determined using infrared spectroscopy (e.g. Fourier transformed infrared spectroscopy, FTIR; such as attenuated total reflectance FTIR, ATR-FTIR, or specular FTIR).

In embodiments, the diamond layer may be a diamond heat sink or heat spreader. In embodiments, the diamond layer may have a thermal conductivity of at least 200 $Wm^{-1}K^{-1}$. The diamond heat sink or spreader may, for example, facilitate heat dissipation from a thermal hot spot in the semiconductor device (e.g. an active area of a device, such as a channel region, or a contact region). In embodiments, the diamond layer may make an ohmic or Schottky contact with the Ga-based layer and/or metal layer. In embodiments, the diamond layer may be a coalescent microcrystalline diamond layer having an average grain size of 200 nm or more, usually 1 μm or more. In embodiments, the diamond layer may have a thickness of 100 nm or more, 150 nm or more, or 500 nm or more. In embodiments, the diamond layer may comprise dopants (e.g. N, B or P). The dopants may enhance the electrical and/or thermal conductivity of the diamond layer.

In embodiments, the substrate may comprise a via and the surface region may abut the via. In embodiments, the via may be empty, or may be at least partially filled with a diamond seed layer or a diamond layer. In this context, it is understood that a via is an opening or cavity in the substrate, not comprising the surfaces between which it is defined. As such, the surface region abutting the via entails: (i) that the via opens up the surface region to the environment, when the via is empty; or (ii) that the diamond seed layer or diamond layer contacts the surface region, when the via is at least partially filled therewith.

In embodiments, any feature of any embodiment of the first aspect may independently be as correspondingly described for any embodiment of any of the other aspects.

In a second aspect, the present disclosure relates to an intermediate structure for forming a semiconductor device, comprising: (i) a substrate comprising a Ga-based layer, and (ii) optionally, a metal layer on the substrate; wherein at least one of the Ga-based layer and, if present, the metal layer comprises at least a surface region comprising an F or S termination.

It was found within the present disclosure that an F or S terminated surface region of a Ga-based layer beneficially enables a good isoelectric point for seeding diamond nanoparticles thereon and simultaneously allows to form a covalent bond of the diamond layer formed therefrom with the underlying Ga-based layer. It was further found that the same approach is also suitable for surface regions of metal layers in Ga-based semiconductor devices.

In embodiments, any feature of any embodiment of the second aspect may independently be as correspondingly described for any embodiment of any of the other aspects.

In a third aspect, the present disclosure relates to a method for forming the intermediate structure as defined in any of the previous claims, comprising: (a) providing a substrate comprising a Ga-based layer, and (b) optionally, providing a metal layer on the substrate; wherein at least one of the Ga-based layer and, if present, the metal layer comprises at least a surface region having an isoelectric point of less than 7, usually at most 6. This method, together with several further optional steps, is schematically depicted in FIG. 1.

In embodiments, step a may comprise: (a1) providing the substrate comprising the Ga-based layer, the Ga-based layer comprising a surface region having an isoelectric point of at least 7, usually at least 8; and (a2) fluorinating or sulfurizing the surface region, thereby modifying the isoelectric point of the surface region to be less than 7, usually at most 6. In embodiments, the Ga-based layer in step a1 may be terminated by Ga or by a group 15 (i.e. pnictogens) or group 16 (i.e. chalcogens) element. In such a case, the Ga-based layer may typically have an isoelectric point of at least 7. The Ga-based layer in step a1 may be polar or non-polar. In embodiments, step a may comprise preparing the surface region before step a2. For example, annealing (cf. infra) the Ga-based layer's surface region may be typically used before fluorinating or sulfurizing it.

In embodiments, step b, if present, may comprise: (b1) providing a metal layer on the substrate, the metal layer comprising a surface region having an isoelectric point of at least 7, usually at least 8; and (b2) fluorinating or sulfurizing the surface region, thereby modifying the isoelectric point of the surface region to be less than 7, usually at most 6. In embodiments, step b may comprise preparing (e.g.oxidizing, cf. infra) the surface region before step b2. For example, oxidizing (cf. infra) the metal layer's surface region may typically be performed before fluorinating it, and may also be performed before sulfurizing it.

In embodiments, fluorination may comprise use of a F-based plasma treatment. In embodiments, the F-based plasma treatment may be performed at a power of 100 W or and less for a duration of 30 s or less. In embodiments, sulfurizing may comprise an ammonium sulphide treatment. In embodiments, the ammonium sulphide treatment may comprise exposure to an ammonium sulphide solution (e.g. an organic solution thereof) for a duration of 1-60 min, or to an ammonium sulphide vapour fora duration of 1-10 min. In embodiments, sulfurizing may further comprise a hydrogen sulphide annealing. In embodiments, the hydrogen sulphide annealing may comprise a rapid thermal annealing in the temperature range of 400-500° C. in $H_2S/N_2$ (e.g. a 5%/95% $H_2S/N_2$) for a duration of 60 s or less (e.g. 30 s or less, 15 s or less, such as 10 s).

In embodiments, step a (e.g. prior to step a2) or step b (e.g. prior to step b2) may comprise forming a via in the substrate to expose the surface region. As such, the surface region can also be present below the Ga-based layer or the metal layer.

In embodiments, step a (e.g. prior to step a2) or step b (e.g. prior to step b2) may comprise preparing the surface region. In embodiments, the surface region may be provided with a passivation layer (e.g. thereon and preparing the surface region may comprise removing the passivation layer to expose the surface region. In embodiments, the passivation layer may be a dielectric layer (e.g. a high-k dielectric layer, such as $AlO_x$, $HfO_x$, $SiN_x$) or a native oxide, such as an amorphous gallium oxide) For example, the Ga-based layer may come with a passivation layer provided by the manufacturer (e.g. deposited in situ in the growth chamber) in order to protect the as-grown Ga-based layer from exposure to air and/or humidity (which forms a native oxide passivation layer) and contaminants (e.g. carbon-based materials, such as organic hydrocarbons). In alternative or complementary embodiments, preparing the surface region may comprise removing contaminants from the surface region. In embodiments, preparing the surface region may comprise annealing the surface region. In embodiments, annealing the surface region may comprise annealing in vacuum, $N_2$ or $N_2/H_2$ at a temperature between 500-600° C. for about 60 min (e.g. in a conventional annealing oven) or by a corresponding rapid thermal annealing (RTA). Annealing the surface region beneficially allows for the removal of unintended surface groups (e.g. halogen groups), oxide or carbon-based residues from the surface region, to remove scratches or polishing marks and to promote surface reconstruction before surface treatment. Annealing may be performed in particular when the Ga-based layer comprises the surface region. In embodiments, preparing the surface region may comprise oxidizing the surface region (e.g. by plasma oxidation). Oxidizing the surface region can facilitate forming a clean surface free of contaminants (e.g. carbon-based residues). Oxidizing may be performed in particular when the metal layer comprises the surface region.

In embodiments, the method may further comprise: (c) seeding diamond particles onto the surface region. In embodiments, step c may comprise contacting (e.g. spin coating, dip coating or spray coating) a diamond particle mixture with the surface region. In embodiments, the surface region may not have been scratched or marked (e.g. by ultrasonication or polishing) before or during step c. In embodiments, the diamond particle mixture may be an aqueous diamond particle solution or suspension. In embodiments, the diamond particles may be diamond nanoparticles (e.g. with a particle size of from 5 up to—but not including—500 nm, usually from 5 to 200 nm, such as 5 to 10 nm) and/or diamond microparticles (e.g. with a particle size of from 0.5 to 1.5 μm). In embodiments, step c may comprise seeding diamond nanoparticles and seeding diamond microparticles in successive steps. In embodiments, the surface region may have a negative zeta potential. In embodiments, particularly during step c, the surface region may be in contact with a medium having a pH higher than the isoelectric point of the surface region. When the surface region is in contact with the medium having the pH higher than its isoelectric point, the surface region can typically have a negative zeta potential. In embodiments, the medium may have a pH between 2 and 8. This medium may, for example, be the diamond particles mixture.

In some embodiments, the diamond particles may have a positive zeta potential. The diamond particles may, for example, be hydrogen-terminated. Hydrogen-terminated diamond particles may be hydrophobic particles. They are typically positively charged in a medium having a pH between 2 and 8; they may, for example, have a zeta potential of about 50 mV in an aqueous suspension having a pH of 5.5. In other embodiments, the diamond particles may have a negative zeta potential. Alternatively, the diamond particles may, for example, be oxygen-terminated. Oxygen-terminated diamond particles may be hydrophilic particles. They are typically negatively charged in a medium having a pH between 2 and 8; they may, for example, have a zeta potential of about −40 mV in an aqueous suspension having a pH of 5.5. The colloidal stability of hydrogen-terminated diamond particles can be typically higher than that of oxygen-terminated diamond particles. For example, oxygen-terminated diamond particles may typically display a tendency to cluster and agglomerate, and their behaviour may vary as a function of the pH. Conversely, hydrogen-terminated diamond particles may typically be relatively independent of pH (e.g. their zeta potential may be relatively constant) in the pH range of 3 to 8 and their colloids may only become unstable at pH values above 9. Alternative reasons for using hydrogen-terminated diamond particles over oxygen-terminated diamond particles may be related to the higher nucleation density of hydrogen-terminated diamond particles and/or their suitability for a wider range of surfaces. Furthermore, within the present disclosure, the surface region usually has a negative zeta potential, while the diamond particles usually has a positive zeta potential. The coulombic attraction between both then allows for a good seeding of the diamond particles onto the surface region. It was observed that, particularly under those conditions, the diamond layer grown in step d can be highly coalescent. The above notwithstanding, the disclosure may in embodiments still work using diamond particles with a negative zeta potential, nevertheless these may be less effective and their colloidal suspensions may be less stable.

In embodiments, the method may further comprise: (d) growing a diamond layer from the seeded diamond particles. In embodiments, step d may comprise a chemical vapour deposition (CVD; e.g. microwave plasma-enhanced CVD or hot wire CVD). In embodiments, step d may be performed in the presence of from 1 to 4% (e.g. 3%) $CH_4$ of a total gas flow rate (e.g. in standard cubic centimeters per minute, SCCM). In embodiments, the gas flow may comprise $H_2$, $CH_4$ and optionally other precursors.

In embodiments, the diamond layer may be a coalescent microcrystalline diamond layer having an average grain size of 200 nm or more, usually 1 μm or more. In embodiments, the diamond may have a thickness of 100 nm or more, 150 nm or more, or 500 nm or more. In embodiments, the diamond layer may have a thermal conductivity of at least 200 $Wm^{-1}K^{-1}$. In embodiments, the diamond layer may comprise dopants (e.g. N, B or P). The dopants may beneficially enhance the electrical and/or thermal conductivity of the diamond layer.

In some embodiments, step d of growing the diamond layer may be performed at a temperature of 500° C. or below (e.g. between 350-500° C., such as 400° C.). Step d can beneficially be performed as a low-temperature diamond growth, thereby being compatible with lower thermal budget substrates. Low-temperature diamond growth can be facilitated because of the protective effect of the functionalized surface region, e.g. in case of an F or S functionalization of GaN. Indeed, GaN without functionalization typically shows a tendency to be etched under conditions typically used for diamond growth, so that diamond growth needs to be performed at a sufficiently high speed and thus at a relatively high temperature (e.g. 500° C. or more). In alternative embodiments, step d of growing the diamond layer may be performed at a temperature of more than 500° C. (e.g. between 500-800° C.).

In embodiments, the surface region having an isoelectric point of less than 7 may form a pattern with respect to an adjacent surface region having an isoelectric point of at least 7. A pattern based on the isoelectric point may be used to control where diamond particles are seeded and thus where the diamond layer will grow.

In embodiments, any feature of any embodiment of the third aspect may independently be as correspondingly described for any embodiment of any of the other aspects.

In a fourth aspect, the present disclosure relates to a method for forming the intermediate structure as defined in any of the previous claims, comprising: (a) providing a substrate comprising a Ga-based layer, and (b) optionally, providing a metal layer on the substrate; wherein at least one of the Ga-based layer and, if present, the metal layer comprises at least a surface region comprising an F or S termination.

In embodiments, step a may comprise: (a1) providing the substrate comprising the Ga-based layer, the Ga-based layer comprising a surface region not comprising an F or S termination; and (a2) fluorinating or sulfurizing the surface region.

In embodiments, step b, if present, may comprise: (b1) providing a metal layer on the substrate, the metal layer comprising a surface region not comprising an F or S termination; and (b2) fluorinating or sulfurizing the surface region.

In embodiments, any feature of any embodiment of the fourth aspect may independently be as correspondingly described for any embodiment of any of the other aspects.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

Example 1

Figure 2:
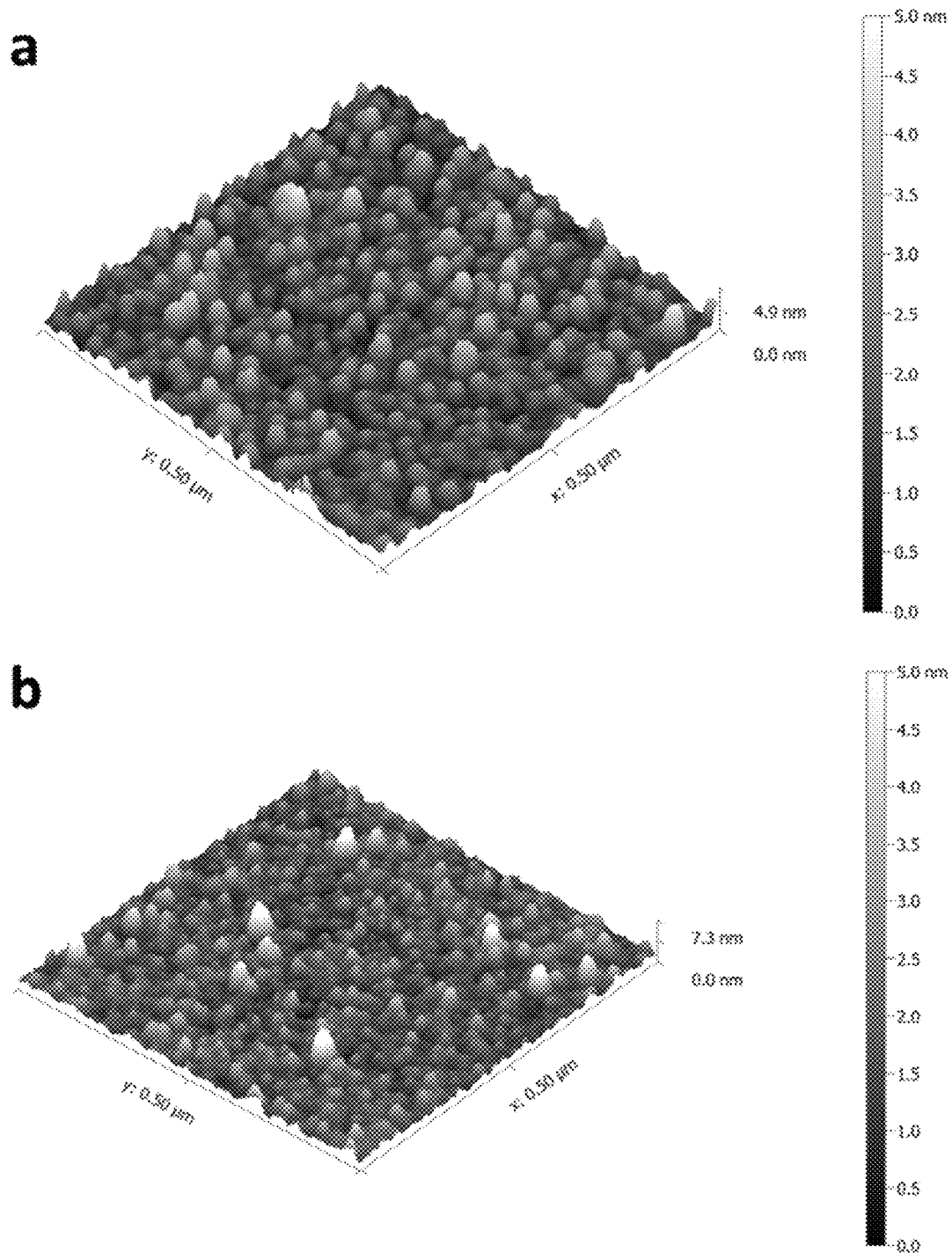
FIG. 2 depicts atomic force microscopy (AFM) images of a representative GaN surface (a) before and (b) after fluorination, in accordance with embodiments of the present disclosure.
Figure 3:
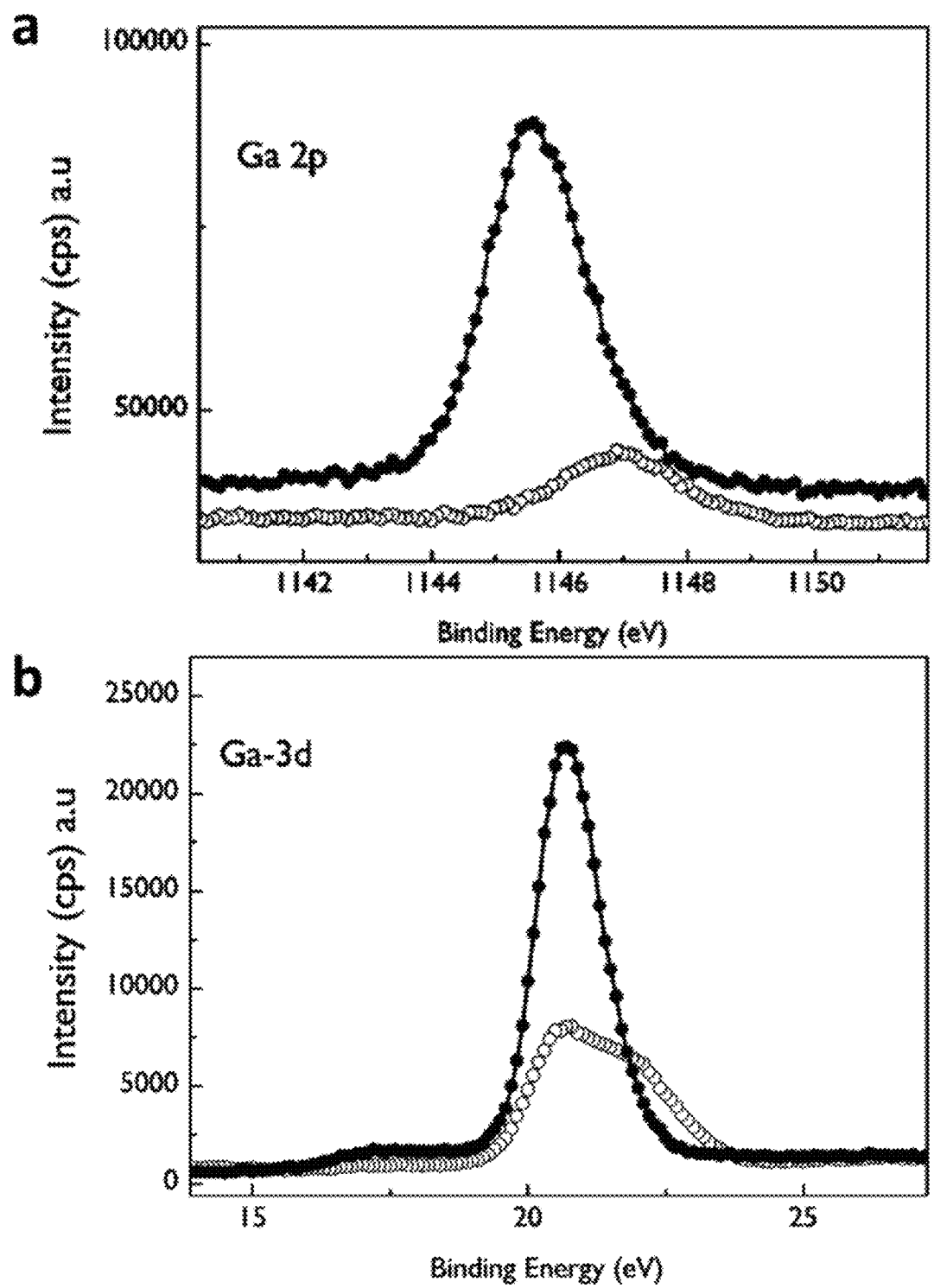
FIG. 3 depicts (a) Ga 2p, (b) Ga 3d, (c) N 1s and (d) F 1s X-ray photoelectron spectroscopy (XPS) spectra of the surfaces of a representative GaN surface before (full dots) and after (open circles) fluorination, in accordance with embodiments of the present disclosure.
Figure 3:
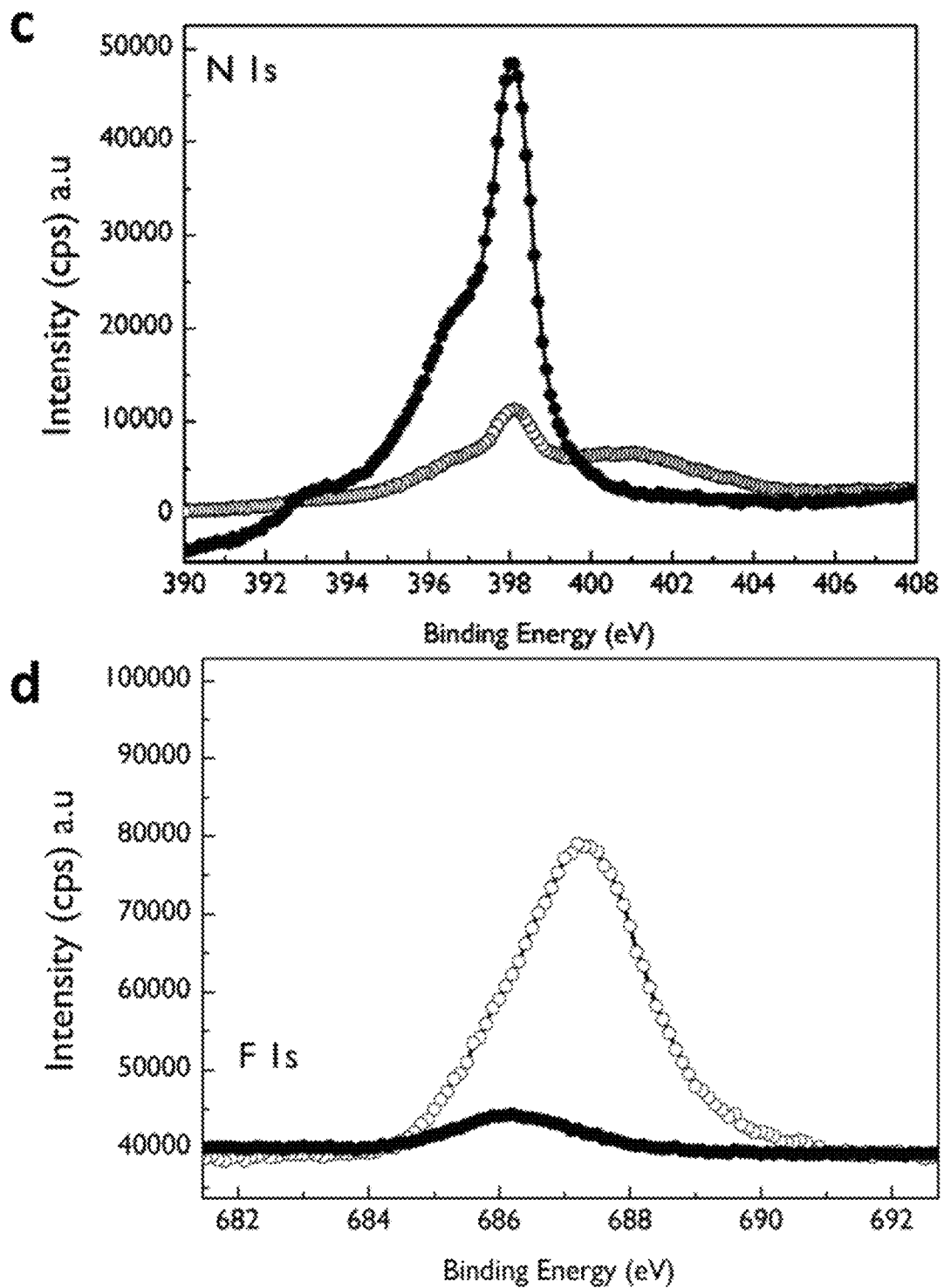

Experimental Results for Intermediate Structures According to Embodiments of the Present Disclosure A substrate comprising a GaN epitaxial layer over a Si substrate is provided and a top surface thereof is fluorinated as described in Example 2a. AFM images of the GaN surface (a) before and (b) after fluorination are shown in FIG. 2. The average surface height ($R_a$) corresponded to 0.434 nm before and 0.364 nm after fluorination, while the root-mean-square surface height ($R_{rms}$) corresponded to 0.561 nm before and 0.486 nm after fluorination. XPS spectra of the GaN surface before (full dots) and after (open circles) fluorination are shown in FIG. 3.

Figure 4:
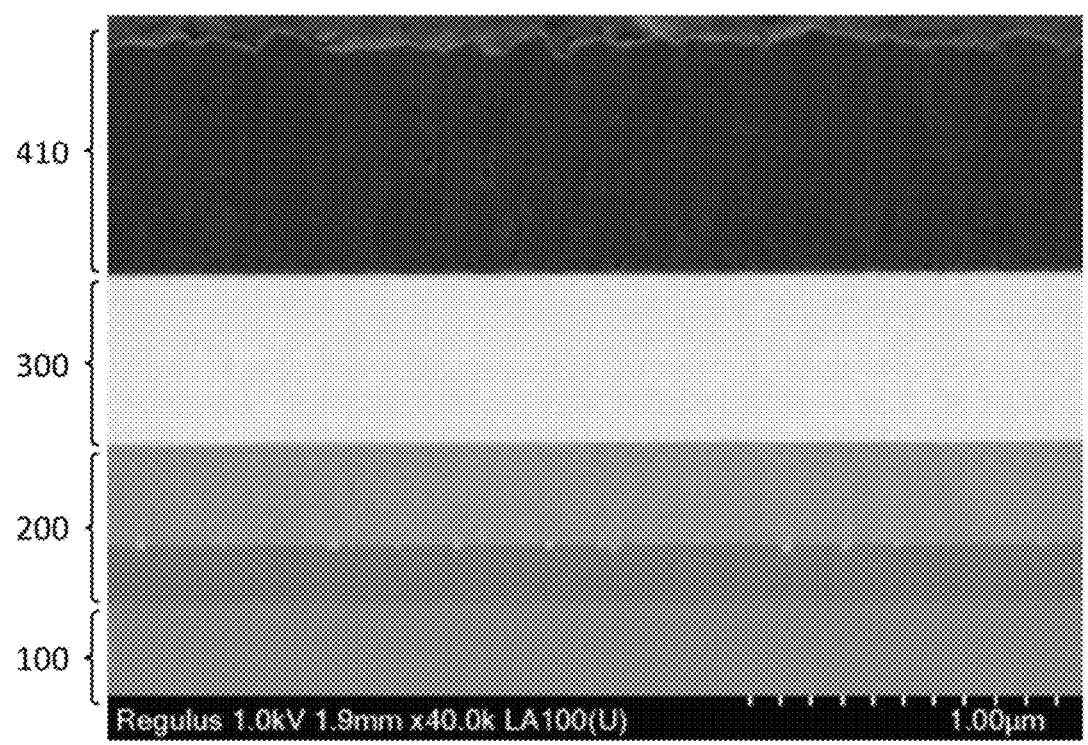
FIG. 4 depicts a cross-sectional transmission electron microscopy (TEM) image, after ion milling, of a representative diamond layer grown on a fluorinated GaN surface in accordance with embodiments of the present disclosure.
Figure 5:
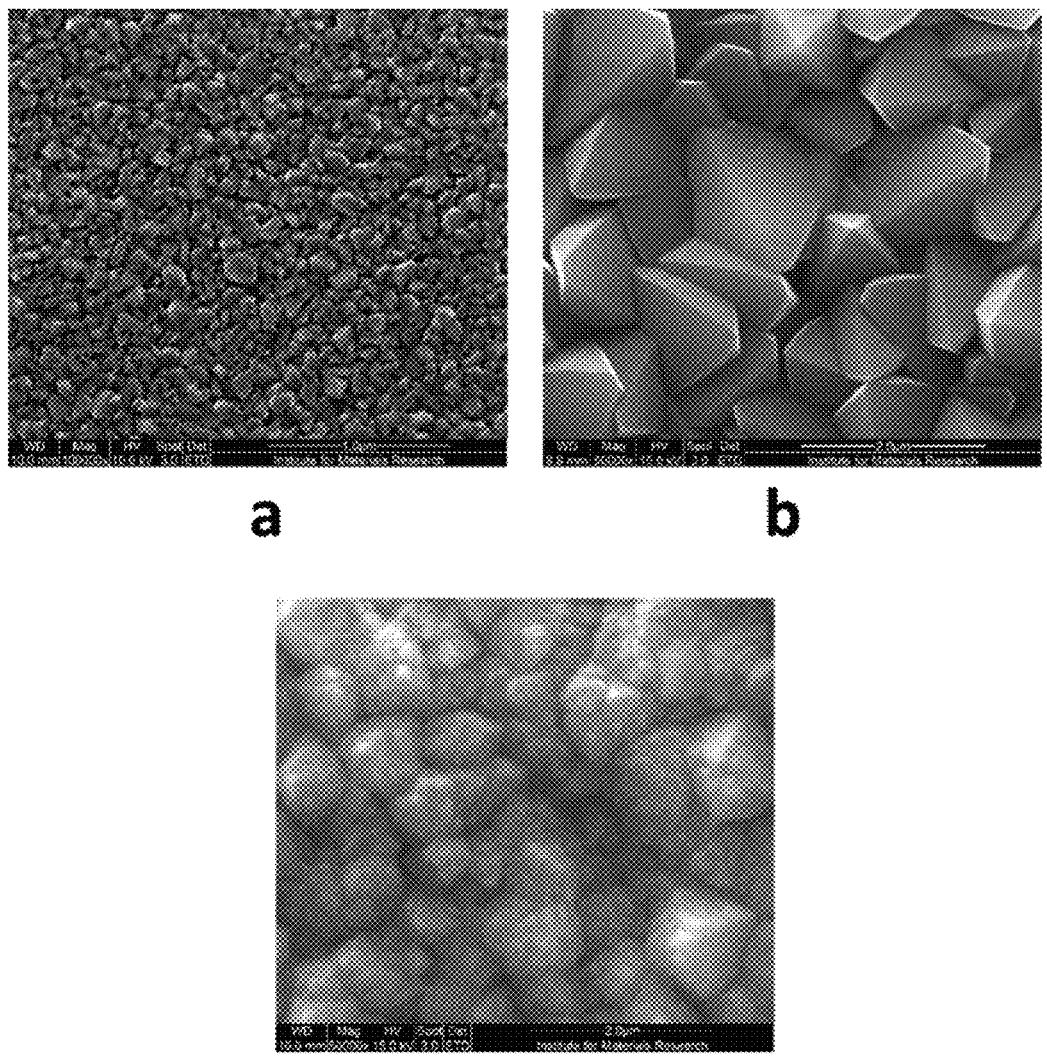
FIG. 5 depicts scanning electron microscopy (SEM) images showing the surface morphology for different growth conditions of representative diamond layers grown on a representative GaN surface in accordance with embodiments of the present disclosure. The SEM images show the surface morphology of the obtained diamond layers for different growth conditions: low-temperature growth (about 400° C.) of (a) with 1-4% $CH_4$ and to a thickness of about 150 nm, (b) with 1% $CH_4$ and to a thickness of about 500 nm, and (c) with 3% $CH_4$ and to a thickness of about 500 nm.

A diamond layer is then grown on the fluorinated surface as described in Example 2a. FIG. 4 shows a cross-sectional TEM image, after ion milling, of the diamond layer grown on the fluorinated GaN surface, wherein the silicon wafer (100), buffer layers (200), GaN layer (300) and a polycrystalline diamond layer (410) with a thickness of about 750 nm can be discerned. FIG. 5, parts a-c, depicts scanning electron microscopy (SEM) images showing the surface morphology of the obtained diamond layers for different growth conditions: low-temperature growth (about 400° C.) of (a) with 1-4% $CH_4$ and to a thickness of about 150 nm, (b) with 1% $CH_4$ and to a thickness of about 500 nm, and (c) with 3% $CH_4$ and to a thickness of about 500 nm.

Example 2

Illustrative Process Flows for Forming Intermediate Structures According to the Present Disclosure Example 2a: Diamond Growth After Fluorination of a Ga-Based Surface Region Referring to FIG. 6, part a, a substrate with a Ga-based layer (300) (e.g. GaN) is provided. The substrate may be a Ga-based substrate as such (e.g. a GaN wafer) or may comprise a Ga-based layer over a carrier layer of a different material (e.g. an epitaxial GaN over a Si wafer; optionally with one or more buffer layers in between GaN and Si, which facilitate the epitaxial growth of GaN on Si). The Ga-based layer (300) is at this stage not yet prepared (e.g. cleaned) and is typically covered with a passivation layer (500), e.g. in the form of dielectric layer (e.g. deposited as a protective layer by chemical vapor deposition, CVD; or atomic layer deposition, ALD) and/or a native oxide layer.

Figure 6:
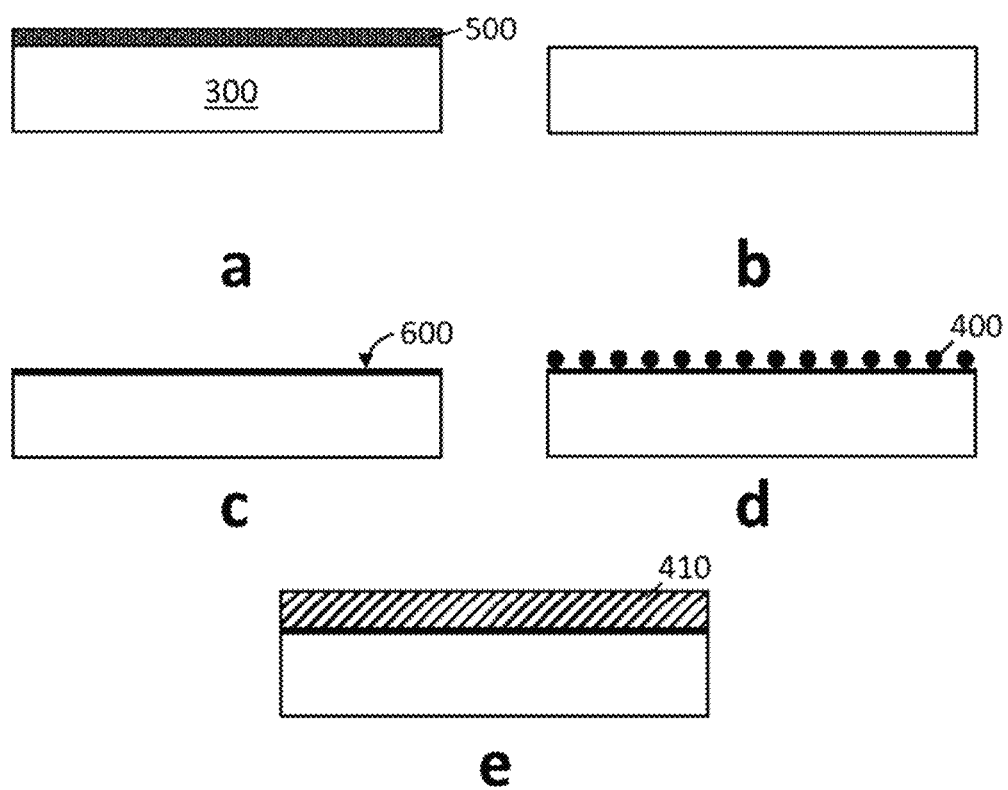
FIG. 6, parts a to e, schematically depict different steps in exemplary process flows according to embodiments of the present disclosure.

Referring to FIG. 6, part b, the Ga-based layer (300) is prepared to obtain a pristine Ga-surface region. This step typically depends on the nature of the Ga-based layer (300) and the passivation layer (500) thereon and substeps are typically selected in function thereof. The preparation may, for example, comprise removing organic contaminants by cleaning the substrate with a solvent (e.g. isopropanol or acetone), followed by etching away the dielectric layer (if present) and annealing the Ga-based layer (300) (e.g. in hydrogen at 1 atm between 400-600° C. for 60 min or an equivalent rapid thermal annealing). If desired, the native oxide layer can be removed by etching in diluted HCl, HF or buffered oxide etch (BOE) for 30 s or less, followed by a thorough rinse with deionized water. The preparation can be terminated by blow drying the surface region in $N_2$.

Referring to FIG. 6, part c, the surface region is fluorinated (600) by exposing it to an F plasma for 30 s or less at a power of 100 W or less; thereby forming a $GaF_x$ surface region (600). The $GaF_x$ (600) may, for example, correspond to 1-3 monolayers, i.e. a thickness of 1 nm or less.

Referring to FIG. 6, part d, the surface region (600) is then seeded with diamond particles (400). This may comprise spin, dip or spray coating the surface region (600) with an aqueous diamond nano and/or micro seeding solution. Excess diamond particles (400) are subsequently washed away. In a particular embodiment, the surface region (600) may be first seeded with nanodiamond particles (400) and subsequently with microdiamond particles (400).

Referring to FIG. 6, part e, the substrate is loaded in a chamber for low temperature (e.g. from 350 to 500° C.) or high temperature (e.g. above 500 to 800° C.) diamond growth, thereby turning the diamond particles (400) into a diamond layer (410). This diamond growth may further include doping with B, P or N.

Example 2b: Diamond Growth After Sulfurization of a Ga-Based Surface Region

Example 2a is repeated, except that in the step relating to FIG. 6, part c, the surface region (600) is sulfurized rather than fluorinated. This can be achieved by e.g. exposing the surface region (600) to ammonium sulphide in the form of an ammonium sulphide based organic solution for 1-30 min or in the form of an ammonium sulphide based vapour exposure for 1-10 min, or to hydrogen sulphide in the form of a hydrogen sulphide based (e.g. 5% $H_2S$/95% $N_2$) rapid thermal annealing at 400-500° C. for about 30 s, thereby forming a $GaS_x$ surface region (600). The $GaS_x$ (600) may for example again correspond to 1-3 monolayers, i.e. a thickness of 1 nm or less.

Example 2c: Diamond Growth on a Metal Layer

Figure 7:
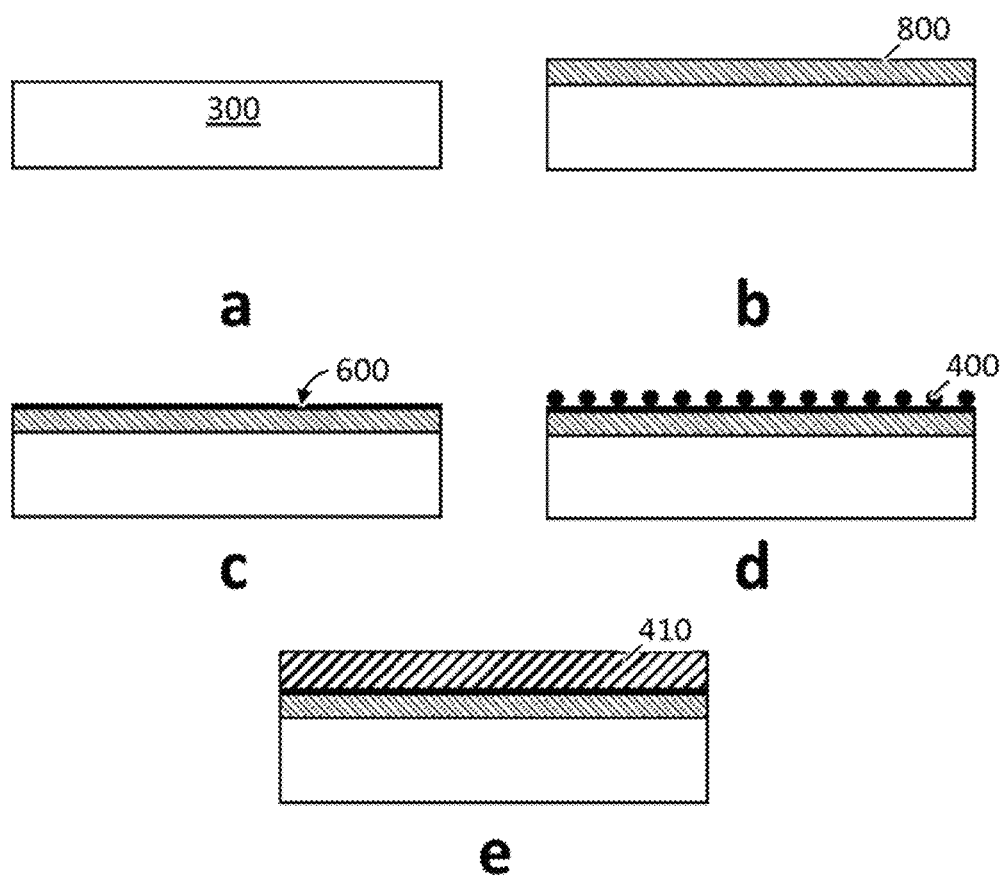
FIG. 7, parts a-e, schematically depict different steps in exemplary process flows according to embodiments of the present disclosure.

Referring to FIG. 7, part a, as in Example 2a and Example 2b, a substrate with a Ga-based layer (300) (e.g. GaN) is provided. The substrate may be a Ga-based substrate as such (e.g. a GaN wafer) or may comprise a Ga-based layer over a carrier layer of a different material (e.g. an epitaxial GaN over a Si wafer; optionally with one or more buffer layers in between GaN and Si, which facilitate the epitaxial growth of GaN on Si).

Referring to FIG. 7, part b, a metal layer (800) (e.g. Cu) is deposited over the substrate, e.g. by evaporation, sputtering or electrodeposition. The surface region (600) of the metal layer (800) may be further prepared by plasma oxidation, to remove organic contaminants and to oxidize the surface region (600) to form a thin (e.g. 1-2 nm) metal oxide (e.g. copper oxide) layer.

Referring to FIG. 7, part c, the surface region (600) is then sulfurized by exposing it to ammonium sulphide in the form of an ammonium sulphide based organic solution for 1-30 min or in the form of an ammonium sulphide based vapour exposure for 1-10 min, or to hydrogen sulphide in the form of a hydrogen sulphide based (e.g. 5% $H_2S$/95% $N_2$) rapid thermal annealing at 400-500° C. for about 30 s; thereby forming a metal sulphide (e.g. $CuS_x$) surface region (600). The metal sulphide (600) may for example again correspond to 1-3 monolayers, i.e. a thickness of 1 nm or less.

Alternatively, the surface region (600) can be fluorinated by exposing it to an F plasma for 30 s or less at a power of 100 W or less; thereby forming metal fluoride (e.g. $CuF_x$) surface region (600). The metal fluoride (600) may, for example, correspond to 1-3 monolayers, i.e. a thickness of 1 nm or less.

Referring to FIG. 7, part d, the surface region (600) is then seeded with diamond particles (400). This may comprise spin, dip or spray coating the surface region (600) with an aqueous diamond nano and/or micro seeding solution. Excess diamond particles (400) are subsequently washed away. In a particular embodiment, the surface region (600) may be first seeded with nanodiamond particles (400) and subsequently with microdiamond particles (400).

Referring to FIG. 7, part e, the substrate is loaded in a chamber for low temperature (350-500° C.) diamond growth, thereby turning the diamond particles (400) into a diamond layer (410). This diamond growth may further include doping with B, P or N.

Example 2d: Area Selective Diamond Growth

Figure 8:
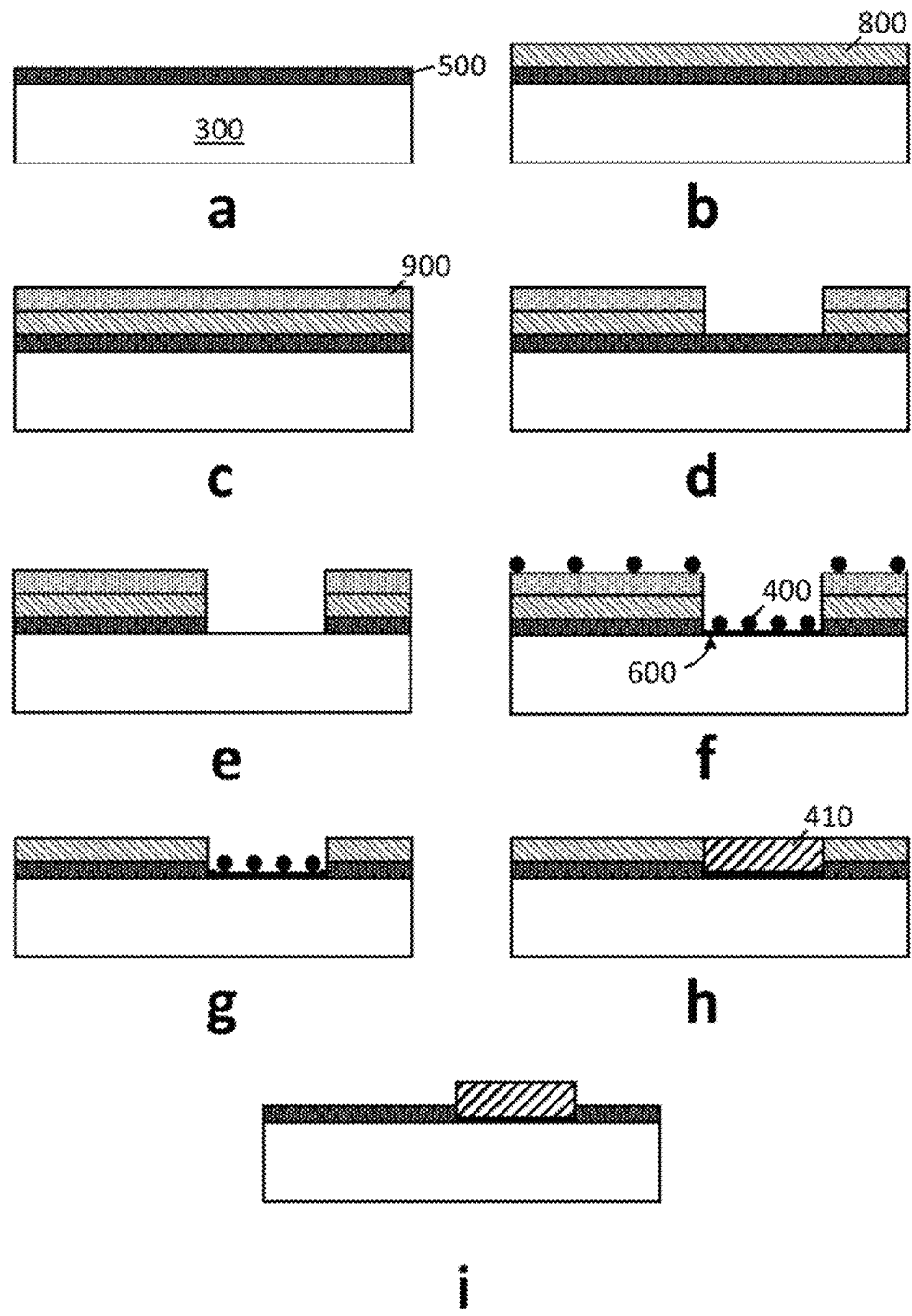
FIG. 8, parts a-i, schematically depict different steps in exemplary process flows according to embodiments of the present disclosure.

Referring to FIG. 8, part a, as in Example 2a and Example 2b, a substrate with a Ga-based layer (300) (e.g. GaN) is provided. The substrate may be a Ga-based substrate as such (e.g. a GaN wafer) or may comprise a Ga-based layer (300) over a carrier layer of a different material (e.g. an epitaxial GaN over a Si wafer; optionally with one or more buffer layers in between GaN and Si, which facilitate the epitaxial growth of GaN on Si). The Ga-based layer (300) is at this stage typically covered with a passivation layer (500), e.g. in the form of a dielectric layer (e.g. deposited as a protective layer by chemical vapor deposition, CVD; or atomic layer deposition, ALD) and/or a native oxide layer.

Referring to FIG. 8, part b, organic contaminants are first removed by cleaning the substrate with a solvent (e.g. acetone or isopropanol) and a 10-20 nm metal layer (800) (e.g. Cu) is then deposited on the passivation layer (500) through evaporation or sputtering.

Referring to FIG. 8, part c, a photoresist (900) is spin-coated over the metal layer (800).

Referring to FIG. 8, part d, a photoresist (900) is patterned and the pattern is transferred by etching it into the metal layer (800), thereby exposing the passivation layer (500).

Referring to FIG. 8, part e, the pattern is transferred further by etching it into the dielectric layer, thereby exposing the Ga-based layer (300) and the corresponding surface region (600). Optionally, the native oxide of the Ga-based layer (300) can be removed by etching in diluted HCl, HF or buffered oxide etch (BOE) for 30 s or less, followed by a thorough rinse with deionized water. The preparation of the surface region (600) can be terminated by blow drying the surface region (600) in $N_2$.

Referring to FIG. 8, part f, the surface region (600) is fluorinated as described in Example 2a or sulfurized as described in Example 2b and then seeded with diamond particles (400). This may comprise spin, dip or spray coating the surface region (600) with an aqueous diamond nano and/or micro seeding solution. Excess diamond particles (400) may be subsequently washed away. In this process, the diamond particles (400) may stick less well, or not at all, to the photoresist (900) as compared to the Ga-based layer (300)'s surface region (600). In a particular embodiment, the surface region (600) may be first seeded with nanodiamond particles (400) and subsequently with microdiamond particles (400).

Referring to FIG. 8, part g, the photoresist (900) is removed (e.g. using acetone), leaving behind the metal layer (800) and the diamond particles (400) seeded on the Ga-based layer (300)'s surface region (600).

Referring to FIG. 8, part h, the substrate is loaded in a chamber for low temperature (350-500° C.) or high temperature (500-800° C.) diamond growth, thereby turning the diamond particles (400) into a diamond layer (410). This diamond growth may further include doping with B, P or N. During diamond growth, the metal layer (800) protects the passivation layer (500) from being etched and, in turn, the passivation layer (500) acts as a diffusion barrier for the metal.

Referring to FIG. 8, part i, after diamond growth, the metal layer (800) can be etched away entirely or partially (e.g. by patterning the metal layer (800) to form a metal contact); e.g. using a wet etching which is selective with respect to the passivation layer (500) and diamond layer (410). Any remaining organic residues can be removed by cleaning the substrate with a solvent (e.g. acetone or isopropanol), followed by rinsing with deionized water.

Example 2e: Combination of Different Diamond Layers in a Ga-Based Device

Figure 9:
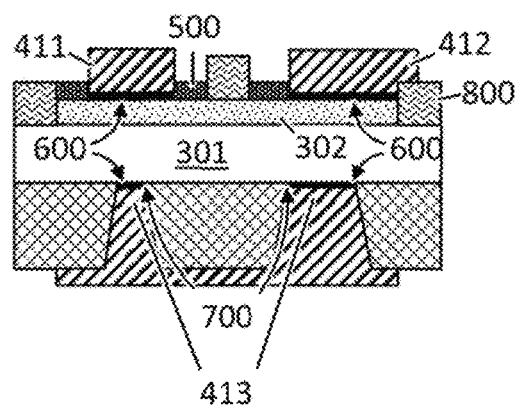
FIG. 9 schematically depicts an exemplary Ga-based device with different diamond layers.

FIG. 9 shows a representative Ga-based device comprising a carrier layer, a first Ga-based layer (301) (e.g. GaN), a second Ga-based layer (302) (e.g. AlGaN), metal layers (800) forming gate and source/drain contacts, and a dielectric passivation layer (500) electrically isolating the metal layers (800). Three diamond layers are also present on the device (e.g. on hot spots), forming heat sinks (or heat spreaders): a first diamond layer (411) on the second Ga-based layer (302), a second diamond layer (412) on the second Ga-based layer (302) and on a metal layer (800), and a third diamond layer (413) in two vias (700) which abut the first Ga-based layer (301). This example illustrates how different diamond layers can be integrated on different surface regions (600) and in different configurations within a single device, based on methods according to the present disclosure.

It is to be understood that although various embodiments, specific constructions, and configurations, as well as materials, have been discussed herein for devices according to the present invention disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

REFERENCE KEY
(100) carrier layer (e.g. Silicon wafer)
(200) buffer layer
(300) Ga-based layer (e.g. GaN or $Ga_2O_3$)
(301) first Ga-based layer
(302) second Ga-based layer
(400) diamond particles
(410) diamond layer
(411) first diamond layer
(412) second diamond layer
(413) third diamond layer
(500) passivation layer
(600) surface region (e.g. fluorinated or sulfurized)
(700) via
(800) metal layer (e.g. Cu)
(900) photoresist

The invention claimed is:

1. An intermediate structure for forming a semiconductor device, comprising:
   a substrate comprising a Ga-based layer, the substrate being a Ga-based substrate or a Ga-based layer over a carrier layer, the Ga-based layer comprising a surface region; and
   a diamond seed layer or a diamond layer on the surface region of the Ga-based layer, wherein the surface region comprises an F or S termination and wherein the surface region has an isoelectric point of less than 7 or at most 6.

2. The intermediate structure according to claim 1, wherein the Ga-based layer comprises Ga and a group 15 or group 16 element.

3. The intermediate structure according to claim 1, wherein the substrate comprises a via and the surface region abuts the via.

4. An intermediate structure for forming a semiconductor device, comprising:
   i) a substrate comprising a Ga-based layer, the substrate being a Ga-based substrate or a Ga-based layer over a carrier layer;
   ii) a metal layer on the substrate, the metal layer having a thermal conductivity of at least 200 $Wm^{-1}K^{-1}$ and comprising a surface; and
   iii) a diamond seed layer or a diamond layer on the surface region of the metal layer,
   wherein the surface region comprises an F or S termination and wherein the surface region has an isoelectric point of less than 7 or at most 6.

5. The intermediate structure according to claim 1, wherein the diamond layer is a coalescent microcrystalline diamond layer having an average grain size of 200 nm or more or an average grain size of 1 µm or more.

6. The intermediate structure according to claim 4, wherein the substrate comprises a via and the surface region abuts the via.

7. The intermediate structure according to claim 4, wherein the Ga-based layer comprises Ga and a group 15 or group 16 element.

8. The intermediate structure according to claim 5, wherein the diamond layer is a coalescent microcrystalline diamond layer having an average grain size of 200 nm or more or an average grain size of 1 µm or more.

9. A method for forming are intermediate structure for forming a semiconductor device,
   said method comprising:
   providing the substrate comprising a Ga-based layer, the substrate being a Ga-based substrate or a Ga-based layer over a carrier layer, the Ga-based layer comprising a surface region having an isoelectric point of at least 7 or at least 8;
   fluorinating or sulfurizing the surface region, thereby modifying the isoelectric point of the surface region to be less than 7 or at most 6; and
   seeding diamond particles onto the surface region.

10. The method according to claim 9, wherein the surface region has a negative zeta potential.

11. The method according to claim 9, further comprising a step of growing a diamond layer from the seeded diamond particles.

12. The method according to claim 11, wherein the diamond layer is a coalescent microcrystalline diamond layer having an average grain size of 200 nm or more or an average grain size of 1 µm or more.

13. The method according to claim 11, wherein the step of growing the diamond layer is performed at a temperature of below 500° C.

14. A method for forming an intermediate structure for forming semiconductor device, said method comprising:
- providing a substrate comprising a Ga-based layer, the substrate being a Ga-based substrate or a Ga-based layer over a carrier layer;
- providing a metal layer on the substrate, the metal layer comprising a surface region having an isoelectric point of at least 7 or at least 8;
- fluorinating or sulfurizing the surface region, thereby modifying the isoelectric point of the surface region to be less than 7 or at most 6; and
- seeding diamond particles onto the surface region.

15. The method according to claim 14, wherein the surface region has a negative zeta potential.

16. The method according to claim 14, further comprising a step of growing a diamond layer from the seeded diamond particles.

17. The method according to claim 16, wherein the diamond layer is a coalescent microcrystalline diamond layer having an average grain size of 200 nm or more or an average grain size of 1 µm or more.

18. The method according to claim 16, wherein the step of growing the diamond layer is performed at a temperature of below 500° C.

* * * * *